US008786167B2

(12) United States Patent
Kounga Njiwa et al.

(10) Patent No.: US 8,786,167 B2
(45) Date of Patent: Jul. 22, 2014

(54) CERAMIC MATERIAL, METHOD FOR THE PRODUCTION OF THE CERAMIC MATERIAL AND COMPONENT COMPRISING THE CERAMIC MATERIAL

(75) Inventors: Alain Brice Kounga Njiwa, Dietikon (CH); Shan-Tao Zhang, Nanjing (CN); Juergen Roedel, Seeheim Juegenheim (DE); Wook Jo, Darmstadt (DE); Torsten Granzow, Darmstadt (DE)

(73) Assignee: EPCOS AG, Munich (DE)

( * ) Notice: Subject to any disclaimer, the term of this patent is extended or adjusted under 35 U.S.C. 154(b) by 574 days.

(21) Appl. No.: 12/990,393

(22) PCT Filed: Apr. 30, 2009

(86) PCT No.: PCT/EP2009/055310
§ 371 (c)(1),
(2), (4) Date: Feb. 8, 2011

(87) PCT Pub. No.: WO2009/133194
PCT Pub. Date: Nov. 5, 2009

(65) Prior Publication Data
US 2011/0291522 A1 Dec. 1, 2011

(30) Foreign Application Priority Data
Apr. 30, 2008 (DE) .................. 10 2008 021 827

(51) Int. Cl.
*H01L 41/187* (2006.01)
(52) U.S. Cl.
USPC ............... 310/358; 252/62.9 R; 252/62.9 PZ

(58) Field of Classification Search
USPC ......... 310/358, 357, 366–367, 328, 311, 365; 252/62.9 PZ, 62.9 R; 501/134, 135
IPC ....................................................... H01L 41/08
See application file for complete search history.

(56) References Cited

U.S. PATENT DOCUMENTS

| 6,004,474 | A | 12/1999 | Takenaka et al. |
| 6,358,433 | B1 * | 3/2002 | Tan et al. ............... 252/62.9 R |
| 6,387,295 | B1 | 5/2002 | Saito |
| 6,531,070 | B1 * | 3/2003 | Yamaguchi et al. ...... 252/62.9 R |
| 8,519,602 | B2 * | 8/2013 | Shibata et al. ................ 310/358 |
| 2003/0134738 | A1 | 7/2003 | Furukawa et al. |

FOREIGN PATENT DOCUMENTS

| JP | 10-100156 | 4/1998 |
| JP | 10-324569 | 12/1998 |
| JP | 2000-313664 | 11/2000 |

(Continued)

OTHER PUBLICATIONS

S. T. Zhang et al., "Lead-fi'ee piezoceramics with giant strain in the system Bi0.5Na0,5TiO3-K0.5Nb03.1 Structure and Room temperature properties", J. Appl. Physics. vol. 103, 034107 (2008).*

(Continued)

*Primary Examiner* — J. San Martin
*Assistant Examiner* — Karen B Addison
(74) *Attorney, Agent, or Firm* — Cozen O'Connor

(57) ABSTRACT

The invention relates to a ceramic binary material and to a method for the production thereof. The material has piezoelectric properties and has a composition of the formula $(1-x)(Bi_{0.5}Na_{0.5}TiO_3) \times (K_{0.5}Na_{0.5}NbO_3)$, where $0<x\le0.15$. Furthermore, the invention relates to a component comprising said material.

13 Claims, 5 Drawing Sheets

(56) References Cited

FOREIGN PATENT DOCUMENTS

| JP | 2002-220280 | 8/2002 |
|---|---|---|
| JP | 2004-186436 | 7/2004 |
| JP | 2007-055864 | 3/2007 |

OTHER PUBLICATIONS

International Preliminary Report on Patentability dated Nov. 9, 2010.

Y.-M. Li et al., "Dielectric Piezoelectric Properties of Na0.5B1O.5T1O3-KO.5B1O.5T1O3-NaNbO3Lead-Free Ceramics" Journal of Electroceramics, Kluwer Academic Publishers, vol. 14, No. 1, pp. 53-58, Jan. 1, 2005.

Y. Yuan et al., "Dielectric and piezoelectric properties of (0.97-x) Bi1/2Na1/2TiO3-xBi1/2K1/2TiO3-0.03NaNbO3 ceramics", Journal of Materials Science, Kluwer Academics Publishers, vol. 41, No. 11, pp. 3561-3567, Apr. 12, 2006.

G. Fan et al., "Phase transition behaviour and electromechanical properties of (Na1/2Bi1/2) Ti03a KnbO3 lead-free piezoelectric ceramics", Journal of Physics D. Applied Physics, vol. 41, No. 3, pp. 35403, Feb. 8, 2007.

Journal of the American Ceramic Society, Aug. 2007 Blackwell Publishing Inc., Commerce Place, vol. 90, No. 8, pp. 2424-2428, Aug. 2007.

R. Zuo et al., Phase structures and electrical properties of new lead-free (Na0.5K0.5) NbO3-(Bi0.5Na0.5)TiO3 cermics, Appl. Phys. Letters, 90, 092904, 2007.

Y. Saito et al., "Lead-Free Piezoceramics", Nature, 432, (4), pp. 84-87, 2004.

T. Tanenaka et al., "Bi0,5Na0,5TiO3-BaTi03 System for leadfree piezoelectric ceramics", Japanese Journal of Applied Physics, vol. 30, No. 9B, pp. 2236-2239, 1991.

S.T. Zhang et al., Giant strain in lead-free piezoceramics Bi0.5Na0.5Tio3-BaTio3-K0.5Na0.5NbO3 (BNT-BT-KNN)-System, Applied Physics Letters 91, 112906, 2007.

S.T. Zhang et al., Lead-free Piezoceramics with giant strain in the system Bi0.5Na0,5TiO3-BaTiO3-K0.5Na0.5NbO3 II. Temperature dependent properties, Feb. 2008.

S.T. Zhang et al., "Lead-free piezoceramics with giant strain in the system Bi0.5Na0,5TiO3-K0.5Nb03.I Structure and Room temperature properties", J. Appl. Physics. vol. 103, 034107 (2008).

Y.M. Li et al., "Dielectric and Piezoelectric Properties of Na0.5Bi0.5Ti03-KO.5Bi0.5Ti03-NaNb03 Lead-Free Ceramics", Journal of Electroceramics, Kluwer Academic Publishers, BO, vol. 14, No. 1, pp. 53-58, Jan. 1, 2005.

Y. Yuan et al., "Dielectric and piezoelectric properties of (0.97-x) Bi1/2Na1/2Ti03-xBi1/2K1/2Ti03-0.03NaNb03 ceramics", Journal of Materials Science, Kluwer Academic Publishers, BO, vol. 41, No. 11, pp. 3561-3567, Apr. 12, 2006.

G. Fan et al., "Phase transition behavior and electromechanical properties of (Na1/2Bi1/2)Ti03-KNb03 lead-free piezoelectric ceramics", Journal of Physics D. applied Physics, IOP Publishing, vol. 41, No. 3, p. 35403, Feb. 8, 2007.

Zuo, R. et al., "Phase Transitional Behavior and Piezoelectric Properties of Lead-Free (Na0.5K0.5)NbO3-(Bi0.5K0.5)TiO3 Ceramics", Journal of the American Ceramic Society, 2007, Blackwell Publishing Inc., vol. 90, No. 8, pp. 2424-2428, Aug. 2007.

Zuo, R. et al., "Phase structures and electrical properties of new lead-free (Na0.5K0.5)NbO3-(Bi0.5Na0.5)TiO3 ceramics", Appl. Phys. Lett. 90, 092904, 2007.

Y. Saito et al., "Lead-Free Piezoceramics", Nature, 432 (4) pp. 84-87, 2004.

Takenaka T. et al., "Bi0,5Na0,5TiO3-BaTi03 System for leadfree piezoelectric ceramics", Japanese Journal of Applied Physics vol. 30, 9B, 2236-2239, 1991.

Zhang, S.T. et al., "Giant strain in lead-free piezoceramics Bi0.5Na0.5Tio3-BaTio3-K0.5Na0.5NbO3 (BNT-BT-KNN)-System", Applied Physics Letters 91, 112906, 2007.

Zhang, S.T. et al., "Lead-free piezoceramics with giant strain in the system Bi0.5Na0.5TiO3-BaTiO3-K0.5Na0.5NbO3. II. Temperature dependent properties", J. Appl. Phys. 103, 034108 (2008).

Zhang, S.T. et al., "Lead-free piezoceramics with giant strain in the system Bi0.5Na0.5TiO3-K0.5Nb03. I. Structure and room temperature properties", J. Appl. Phys. 103, 034107 (2008).

\* cited by examiner

CERAMIC MATERIAL, METHOD FOR THE PRODUCTION OF THE CERAMIC MATERIAL AND COMPONENT COMPRISING THE CERAMIC MATERIAL

RELATED APPLICATIONS

This is a U.S. national stage of application No. PCT/EP2009/055310, filed on Apr. 30, 2009.

This application claims the priority of German application no. 10 2008 021 827.8 filed Apr. 30, 2008, the entire content of which is hereby incorporated by reference.

FIELD OF THE INVENTION

The invention relates to a ceramic material and to a method for the production of the ceramic material. Furthermore, the invention relates to a component comprising the ceramic material and to the use of the component.

BACKGROUND OF THE INVENTION

Materials which undergo a change in their spatial extent when exposed to a specific applied electric field, i.e. materials which have piezoelectric properties, are used, for example, in actuators. For this use, high elongations of the material are desired as a response to the applied electric field. The achievable elongation of the materials is limited by their dielectric strength. In addition, conventional piezoelectric materials have a high lead content, which is harmful to people and the environment.

BRIEF SUMMARY OF THE INVENTION

It is an object of the invention to provide a novel ceramic material which has piezoelectric properties, a high elongation under an applied electric field and also a high dielectric strength. This object is achieved by a material as claimed in claim 1. Further claims relate to embodiments of the ceramic material, to methods for the production of the ceramic material and to a component comprising the ceramic material.

In one embodiment, provision is made of a binary ceramic material comprising the formula $(1-x)(Bi_{0.5}Na_{0.5}TiO_3) \times (K_{0.5}Na_{0.5}NbO_3)$, wherein $0<x\leq0.15$. Binary means that the ceramic material is composed of two components, bismuth sodium titanate $Bi_{0.5}Na_{0.5}TiO_3$ and potassium sodium niobate $K_{0.5}Na_{0.5}NbO_3$, wherein the proportions of the two components are variable depending on the value x used.

The material can have the above-specified composition wherein $0.08 \leq x \leq 0.12$. Materials comprising this range for x have a high elongation and good electrical and mechanical stability.

The material can also be lead-free. The use of toxic lead, for example in actuators, is thus avoided and handling of the material is simplified. By way of example, it is therefore possible to produce electronic components comprising this material which are harmless to people and the environment.

The material can also have a range for x of $0.06 \leq x \leq 0.075$, the material having a morphotropic phase boundary (MPB). The presence of a morphotropic phase boundary indicates the coexistence of a rhombohedral crystal structure and a tetragonal crystal structure of the ceramic material, which can be identified by X-ray diffraction examinations, for example. In this case, the individual components of the material contribute to said phase boundary. Bismuth sodium titanate has a rhombohedral crystal structure and potassium sodium niobate has an orthorhombic crystal structure. The material composition in which the two crystal structures, the rhombohedral and the tetragonal crystal structures, coexist is referred to as the MPB composition. Piezoelectric properties of the material, for example the coupling factor or the dielectric constant of the material, may be greater in the area surrounding this phase boundary than in regions outside the morphotropic phase boundary. Where $x<0.06$, only a rhombohedral crystal structure is present, and where $x>0.075$ only a tetragonal crystal structure is present.

The parameter x of the material can also assume the value $x=0.11$. If the elongation of the material $(1-x)(Bi_{0.5}Na_{0.5}TiO_3) \times (K_{0.5}Na_{0.5}NbO_3)$ is measured where $x=0.11$, an elongation of more than 0.4% is obtained in the case of an applied field of 8 kV/mm.

The parameter x of the material can also take the value $x=0.12$. In the case of an applied field of 8 kV/mm, a material where $x=0.12$ has an elongation of 0.22%. An elongation of more than 0.4% can be achieved if an electric field, for example 9 kV/mm, is chosen. Materials of this type have a good dielectric strength. Compared to ternary materials, which are composed of three components, the binary material also has fewer cations in a unit cell of the crystal structure, and this can make good homogeneity and easy handling of the material possible.

The greater the parameter x of the binary ceramic material is chosen to be, the more the negative elongation in the material is reduced. Negative elongation refers to the difference between the elongation of the material without an applied electric field (zero field), after a field has already been applied for polarizing the material, and the lowest measurable elongation of the material.

Furthermore, it is possible to electrically induce a phase transition from the antiferroelectric phase to the ferroelectric phase by mixing potassium sodium niobate and bismuth sodium titanate, which together produce a solid solution, in the material $(1-x)(Bi_{0.5}Na_{0.5}TiO_3) \times (K_{0.5}Na_{0.5}NbO_3)$, where $0.09 \leq x \leq 0.012$, at room temperature and low frequencies of up to 5 Hz of the electric field. This transition and a subsequent domain reorientation in the ferroelectric phase bring about high elongations of the material.

Depending on the composition of the material, residual stresses are still produced in the material, and these bring about a domain relaxation process if the applied electric field is switched off. Similarly, the ferroelectric phase induced by the field changes to the antiferroelectric phase when the electric field is switched off. This results in remanent polarization, the remaining polarization when the field is switched off, and a low negative elongation. An elongation which is comparable with the otherwise once high polarization elongation can therefore be achieved when an electric field is re-applied. In conventional piezoelectric materials, the elongation during the first polarization process is higher than the elongation during the subsequent unipolar polarization processes. Small negative elongations are therefore desirable, in order to achieve elongations of a similar magnitude to the polarization elongation in each further unipolar loading cycle, i.e. polarization process.

The invention also relates to a method for the production of a material having the above-mentioned properties. The method comprises the following method steps: A) powdery oxygen-containing compounds of Bi, Na, K, Ti and Nb are mixed in a stoichiometric ratio to produce a starting mixture, B) the starting mixture is ground and calcined to produce a powdery solid solution, and C) the powdery solid solution is pressed and sintered. The material can therefore be produced, for example, using a mixed oxide method, in which the stoichiometric ratio is chosen such that a material of the composition $(1-x)(Bi_{0.5}Na_{0.5}TiO_3) \times (K_{0.5}Na_{0.5}NbO_3)$, where $0 \leq x \leq 0.15$, is produced.

In method step A) of the method, starting materials can be selected from a group comprising oxides and carbonates of Bi, Na, K, Ti and Nb. By way of example, $Bi_2O_3$, $Na_2Co_3$, $K_2Co_3$, $TiO_2$ and $Nb_2O_5$ can be selected. These compounds are weighed out and mixed according to the desired stoichiometric ratio.

Furthermore, in method step B), the starting mixture can be ground in a solvent, dried and calcined at a temperature in the range of 800° C. to 950° C. Anhydrous ethanol can be chosen as the solvent, for example, and the calcination can take place, for example, at a temperature of 900° C. with a holding time of, for example, three hours.

Furthermore, in method step C), the powdery solid solution can be ground, for example over a period of 24 hours. The ground powdery solid solution can be pressed to form disks, which are green bodies, and sintered at a temperature in the range of 1050° C. to 1150° C. The pressed disks can have a diameter of 10 mm, for example, and can be pressed at 70 MPa. The sintering can take place at a temperature of 1050° C., for example, and can be carried out in an aluminum-coated container. In order to avoid volatilization of the readily volatile elements bismuth, sodium and potassium, the pressed disks can be embedded in the corresponding powders during the sintering. The density of the sintered material can be between 95% and 98% of the theoretical density.

The invention also relates to a component having at least one ceramic base body and at least two electrodes arranged on the base body, wherein the ceramic layer comprises a material having the above-mentioned properties. The component can also comprise a base body, which comprises a multiplicity of stacked ceramic layers with electrodes arranged therebetween, wherein the electrodes lead out from the stacked ceramic layers and are contacted via external electrodes. By way of example, the electrodes can be contacted in an alternating manner. This makes it possible to provide components which undergo volume elongation when a voltage is applied.

A component of this type can be used, for example, as a piezo actuator or multilayered actuator. By way of example, a piezo actuator can be used for injection systems. However, further possible uses are also conceivable with one of the above-mentioned materials.

The invention will be explained in more detail with reference to the figures and exemplary embodiments:

DETAILED DESCRIPTION OF THE EMBODIMENT OF THE INVENTION

Figure 1:
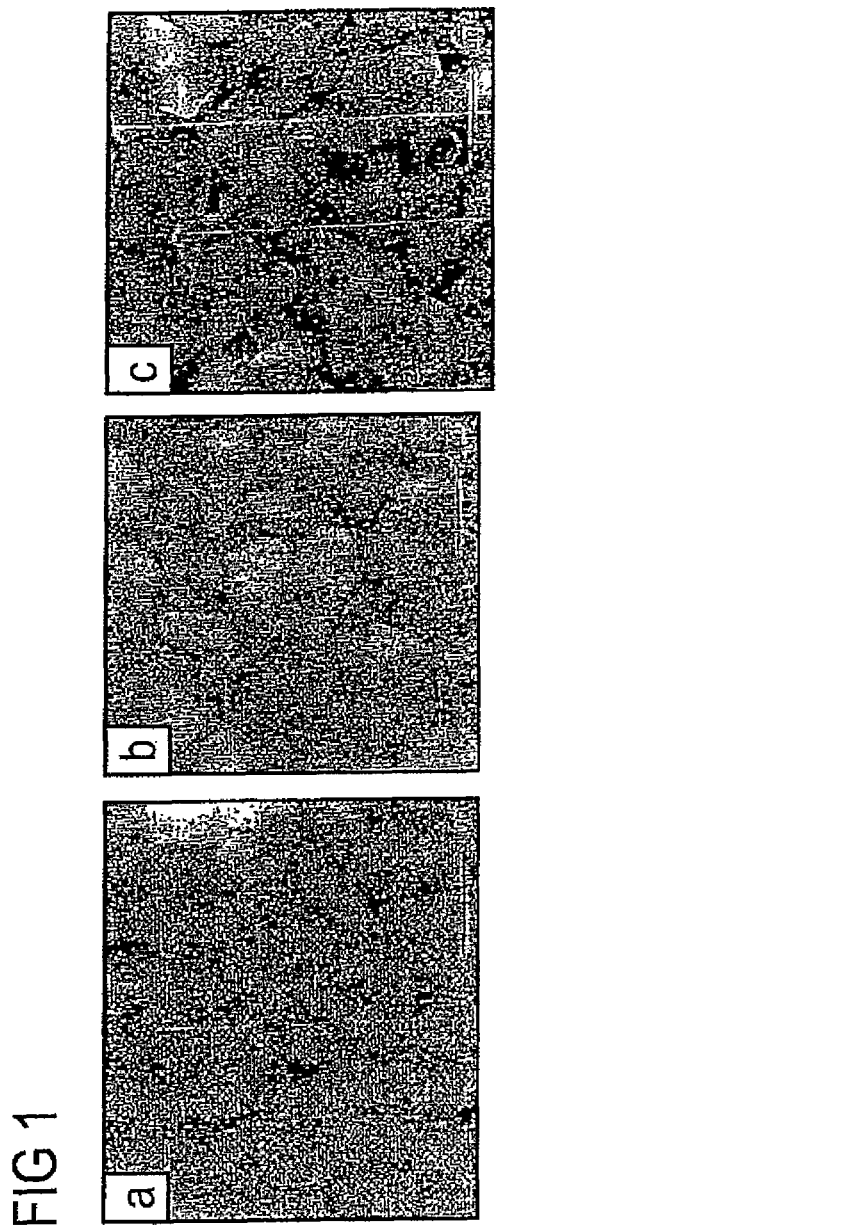
FIG. 1 shows SEM images of the microstructure for exemplary materials.

FIG. 1 shows SEM (scanning electron microscopy) images of the microstructure of the material. FIG. 1$a$ shows the microstructure of a conventional material made of pure bismuth sodium titanate (reference x=0), FIG. 1$b$ shows a material of the formula $(1-x)(Bi_{0.5}Na_{0.5}TiO_3) \times (K_{0.5}Na_{0.5}NbO_3)$, where x=0.06, and FIG. 1$c$ shows a material of the formula $(1-x)(Bi_{0.5}Na_{0.5}TiO_3) \times (K_{0.5}Na_{0.5}NbO_3)$, where x=0.12. The various microstructures show that no secondary phases are present and that the grain size in the material decreases as x increases. The mean grain size is thus 1.2 μm where x=0 and 0.7 μm where x=0.12.

For the SEM images, the respective samples are polished and thermally etched for 45 minutes at 900° C. (at 830° C. where x=0).

The electrical measurements on the material, which are shown in FIGS. 2 to 7 which follow, were carried out on sintered samples in disk form of the respective material. Before the measurements are made, a thin layer of silver is applied to the wide surfaces of the disks and dried for 30 minutes at 500° C. This provides layers of silver which serve as electrodes for the electrical measurements.

Figure 2:
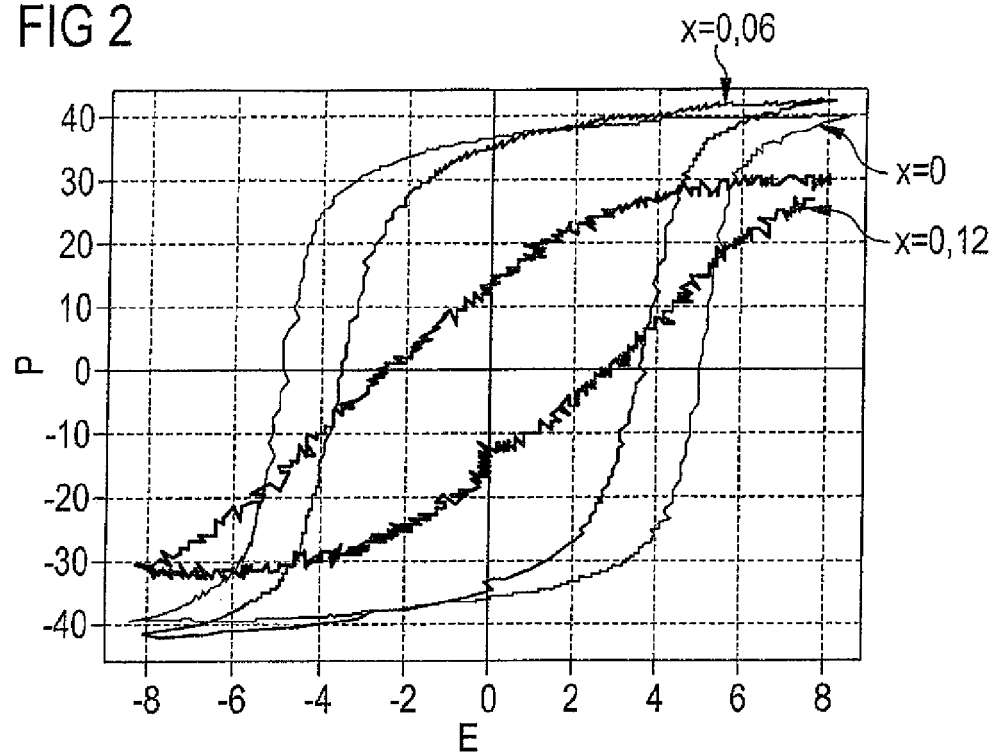
FIG. 2 shows the polarization hysteresis for exemplary materials.

FIG. 2 shows the polarization hysteresis for exemplary materials, where x=0 (reference), x=0.06 and x=0.12. In this figure, the applied field strength E in kV/mm is plotted against the polarization P in μC/cm². An electric field with a triangular waveform and with a frequency of 50 MHz is chosen for the measurement. It can be seen that the coercive field strength $E_c$, the field strength at P=0, decreases as x increases. In the case of a field of E=8 kV/mm, polarization saturation occurs.

Figure 3:
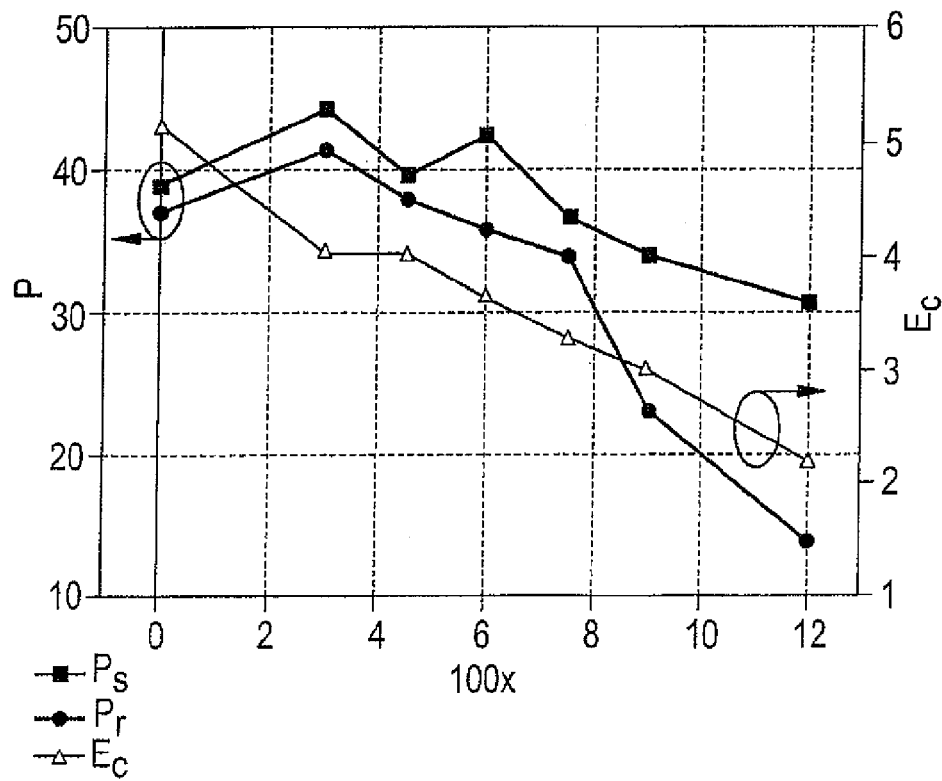
FIG. 3 shows the maximum polarization, the remanent polarization and the coercive field for exemplary materials.

The values for the coercive field strength $E_c$, the maximum polarization $P_s$ and the remanent polarization $P_r$ (at E=0 kV/mm) are given for further exemplary materials in FIG. 3. In this figure, the composition of the material, expressed by the value of x (in %), is plotted against the polarization P in μC/cm². All three values $P_r$, $P_m$ and $E_c$ experience little change when x has a value of up to 0.06, and show a large decrease where x>0.06. By way of example, $E_c$ drops from 5.1 kV/mm to 2.2 kV/mm.

Figure 4:
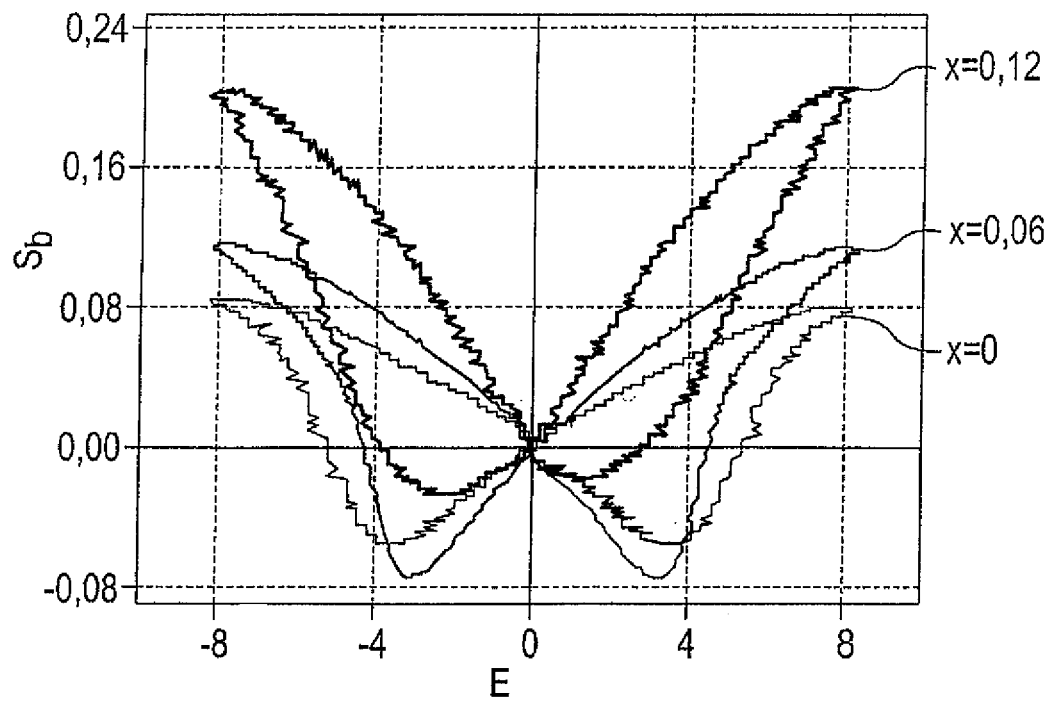
FIG. 4 shows the bipolar elongation hysteresis of exemplary materials.
Figure 5:
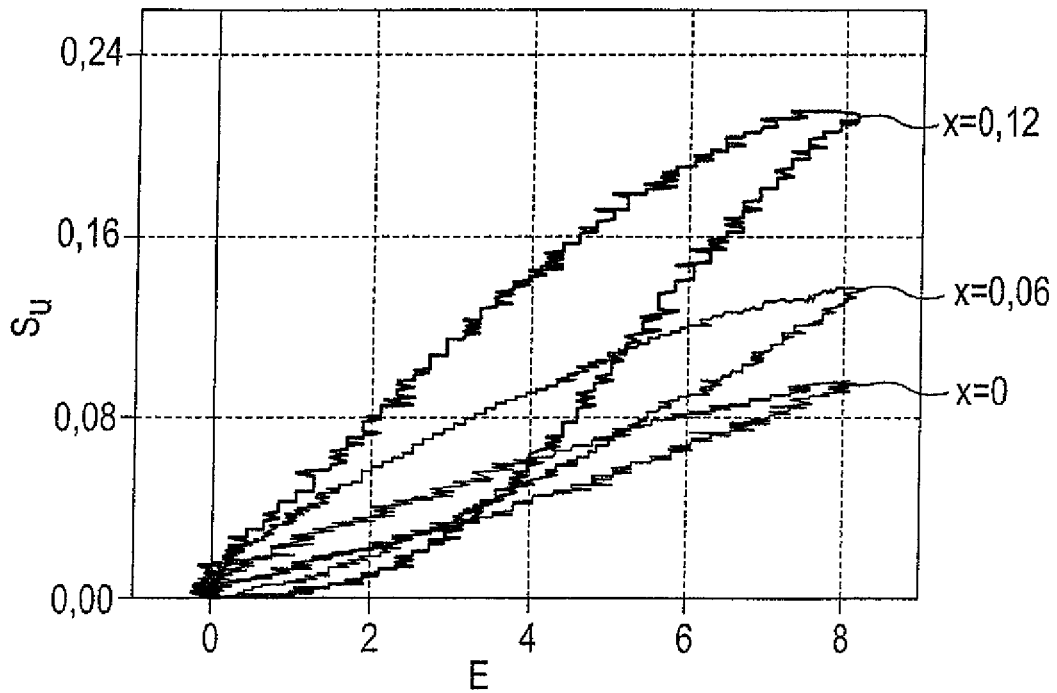
FIG. 5 shows the unipolar elongation hysteresis of exemplary materials.
Figure 6A:
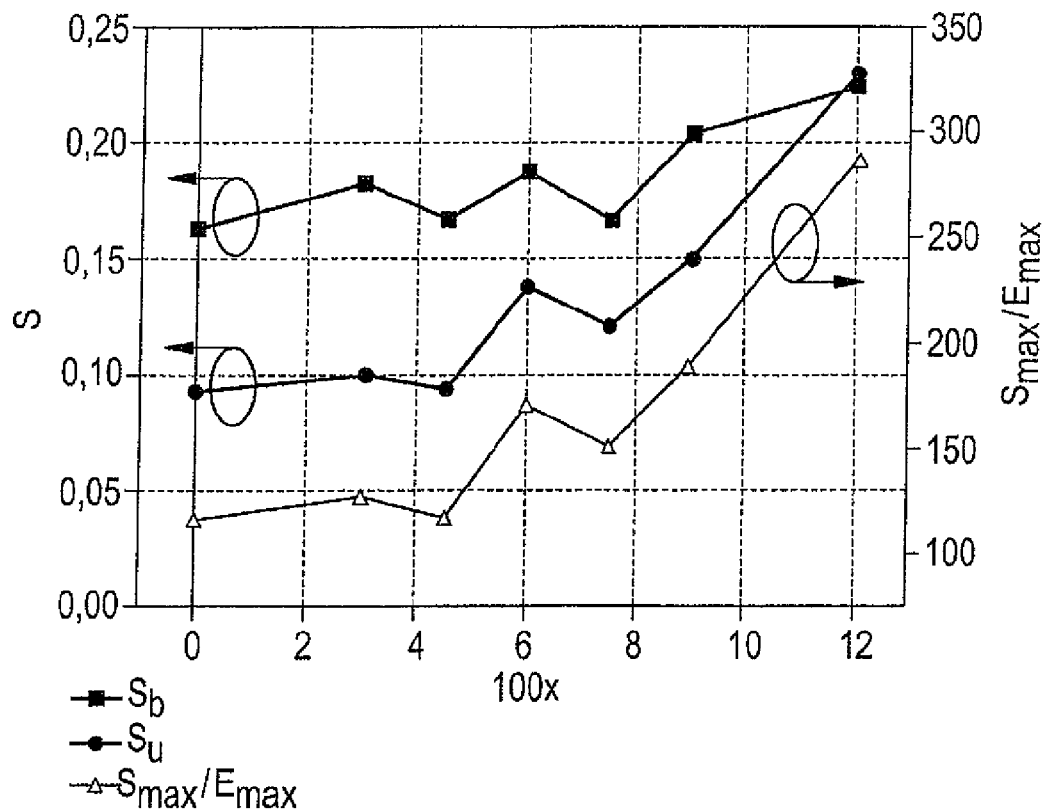
FIG. 6 shows the dependence of the maximum elongation on the composition of the material.
Figure 6B:
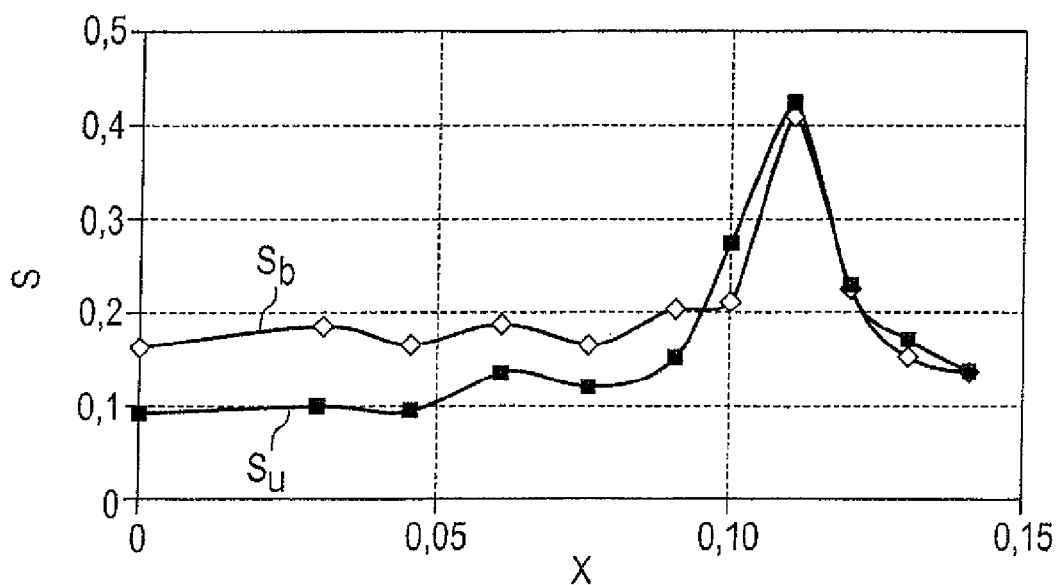

FIGS. 4 to 6 show measurements of the elongation as a function of the applied field. These measurements were made in an oil bath at a frequency of 50 MHz and with a triangular waveform of the field.

FIG. 4 shows the bipolar elongation $S_b$ in % as a function of the applied electric field E in kV/mm for materials where x=0 (reference), x=0.06 and x=0.12. In the case of a bipolar elongation, the applied field E is increased from 0 kV/mm to 8 kV/mm, then reversed to −8 kV/mm and finally increased back to 0 kV/mm. A bipolar variation of the field results in an elongation curve in the form of a butterfly. Analogous to FIG. 4, FIG. 5 shows the unipolar elongation $S_u$ in %. Here, the applied field E is increased from 0 kV/mm to 8 kV/mm and reduced back to 0 kV/mm. A unipolar variation of the field results in an elongation hysteresis of the samples investigated.

FIG. 6$a$ summarizes the characteristic values for materials of the measurements shown for three exemplary materials in FIGS. 4 and 5. The characteristic values are the maximum bipolar elongation $S_b$ and the maximum unipolar elongation $S_u$, and as standardized variable the ratio between the maximum unipolar elongation $S_{max}$ and the maximum applied field $E_{max}$, $S_{max}/E_{max}$ in pm/V as a function of the composition of the material in the form of x in %. FIG. 6$b$ likewise shows the elongations $S_u$ and $S_b$ as a function of x for further selected values of x. Maximum elongations can be seen where x=0.11.

It can be seen in FIG. 6 that the elongation $S_u$ and $S_b$ rises as x increases, i.e. as the proportion of potassium sodium niobate in the material increases, in particular in the range x>0.075, i.e. outside the region of the morphotropic phase boundary. At the same time, the negative elongation, the difference between the elongation at E=0 kV/mm and the lowest elongation, decreases (FIG. 4).

Figure 7:
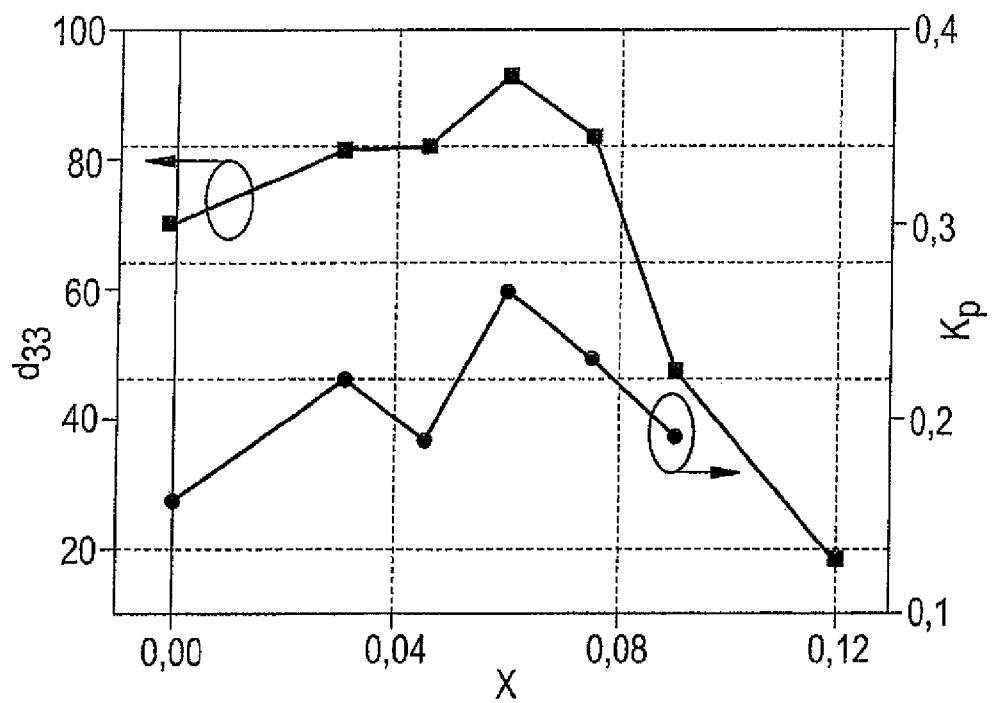
FIG. 7 shows the piezoelectric coefficient and the coupling factor as a function of the composition of the material.

FIG. 7 shows the piezoelectric coefficient $d_{33}$ in pC/N (or pm/V) and the coupling factor $k_p$ as a function of x. $d_{33}$ was determined at E=0 kV/mm using a Berlincourt meter, with samples that were polarized in a field of 7 kV/mm for 5 minutes at room temperature. The electromechanical coupling factor $k_p$ was determined using a resonance/anti-resonance method in an impedance analyzer. $d_{33}$ exhibits a maximum of 94 pm/V where x=0.06, and becomes <20 pm/V where x=0.12.

When the dielectric permittivity $\epsilon_r$ is measured as a function of temperature (at temperatures of 50° C. to 400° C.) at frequencies of 100 Hz to 1 MHz, a material where x=0 (reference) exhibits a maximum of $\epsilon_r$ at T=296° C. As x increases, this temperature is shifted toward smaller values (208° C. to 273° C.). The transition temperature $T_d$, at which the transition from the ferroelectric to the antiferroelectric phase takes place (this can be determined by means of dielectric measurements), is 185° C. where x=0 and less than 150° C. where x>0.075, for example 100° C. to 146° C. depending on the composition.

Figure 8:
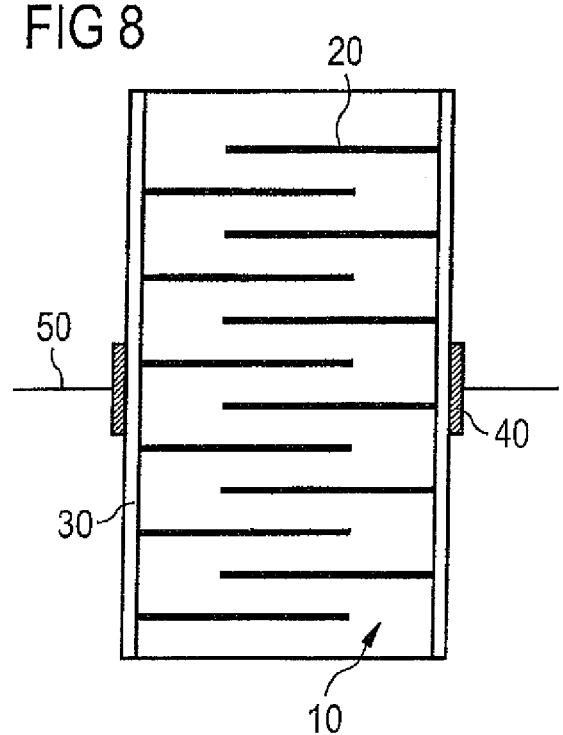
FIG. 8 shows a schematic side view of a component comprising the material.

FIG. 8 shows a schematic side view of a component which contains the material in one of the embodiments described above. The component has a ceramic base body 10 made up of a plurality of ceramic layers which are sintered to form a monolithic base body. The ceramic layers have the ceramic binary material. Electrodes 20 are arranged between the ceramic layers. Furthermore, external electrodes 30, which contact the electrodes 20 in the base body in an alternating manner, are arranged on the sides of the base body. Connection elements 40, which are contacted via conductors 50, are present on the external electrodes.

This component can be used, for example, as a piezo actuator in an injection system. If a field is applied via the conductors 50, the base body 10 undergoes an elongation. When the field is switched off, the elongation of the base body also declines.

The embodiments shown in the figures and exemplary embodiments can be varied as desired. In addition, it should be taken into consideration that the invention is not restricted to the examples, but instead permits further refinements which are not explained here.

List of Reference Numerals

10 Ceramic base body
20 Electrode
30 External electrode
40 Connection element
50 Conductor

The invention claimed is:

1. A ceramic material having the composition (1−x)$(Bi_{0.5}Na_{0.5}TiO_3)$×$(K_{0.5}Na_{0.5}NbO_3)$, wherein 0<x≤0.15, wherein the ceramic material is binary.

2. The material according to claim 1, wherein x is in the range of 0.08≤x≤0.12.

3. The material according to claim 1, wherein said material is lead-free.

4. The material according to claim 1, wherein x is in the range of 0.06≤x≤0.075, and the material has a morphotropic phase boundary.

5. The material according to claim 1, wherein x=0.12.

6. The material according to claim 1, wherein x=0.11.

7. A component having at least one ceramic base body and at least two electrodes arranged on the base body, wherein the base body has a material as claimed in claim 1.

8. The component according to claim 7, wherein the base body comprises a multiplicity of stacked ceramic layers with electrodes arranged therebetween, wherein the electrodes lead out from the stacked ceramic layers and are contacted via external electrodes.

9. The use of the component according to claim 7 as a piezo actuator.

10. A method for the production of a material comprising a ceramic material having the composition (1−x)$(Bi_{0.5}Na_{0.5}TiO_3)$×$(K_{0.5}Na_{0.5}NbO_3)$, wherein 0<x≤0.15, comprising the following steps of:
   A) mixing powdery oxygen-containing compounds of Bi, Na, K, Ti and Nb in a stoichiometric ratio to produce a starting mixture,
   B) grounding and calcining the starting mixture to produce a powdery solid solution,
   C) pressing and sintering the powdery solid solution;
   wherein the ceramic material is binary.

11. The method according to claim 10, wherein, in method step A), the powdery oxygen-containing compounds are selected from a group comprising oxides and carbonates of Bi, Na, K, Ti and Nb.

12. The method according to claim 10, wherein, in method step B), the starting mixture is ground in a solvent, dried and calcined at a temperature in the range of 800° C. to 950° C.

13. The method according to claim 10, wherein, in method step C), the ground powdery solid solution is pressed to form disks and sintered at a temperature in the range of 1050° C. to 1150° C.

* * * * *